(12) United States Patent
Okazaki

(10) Patent No.: US 6,642,545 B2
(45) Date of Patent: Nov. 4, 2003

(54) SEMICONDUCTOR LIGHT EMITTING DEVICE

(75) Inventor: Tadahiro Okazaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/140,259

(22) Filed: May 8, 2002

(65) Prior Publication Data

US 2002/0167015 A1 Nov. 14, 2002

(30) Foreign Application Priority Data

May 9, 2001 (JP) .................................... 2001-138982

(51) Int. Cl.[7] ............................................... H01L 33/00
(52) U.S. Cl. .......................................... 257/89; 257/88
(58) Field of Search ...................................... 257/89, 90

(56) References Cited

U.S. PATENT DOCUMENTS 5,006,908 A * 4/1991 Matsuoka et al. ............ 357/17
5,739,552 A * 4/1998 Kimura et al. ................ 257/89

* cited by examiner

*Primary Examiner*—Wael Fahmy
*Assistant Examiner*—Douglas A. Wille
(74) *Attorney, Agent, or Firm*—Rabin & Berdo, P.C.

(57) ABSTRACT

A semiconductor light emitting device including a first semiconductor light emitting chip in which a first semiconductor light emitting layer is formed on a first substrate, a second semiconductor light emitting chip in which a second semiconductor light emitting layer is formed on a second substrate, and a bonding material for bonding the first semiconductor light emitting chip and the second semiconductor light emitting chip to each other in a stacked state.

21 Claims, 1 Drawing Sheet

SEMICONDUCTOR LIGHT EMITTING DEVICE

BACKGROUND OF THE INVENTION

1. Field of the Invention

The present invention relates to a semiconductor light emitting device used for display lights and the like of various kinds of electric apparatus, and particularly to a semiconductor light emitting device by which a plurality of emission colors can be obtained.

2. Description of Related Art

In a semiconductor light emitting device such as a light emitted diode, when a forward voltage is applied to a p-n junction, an electric energy is converted to a light energy to cause light emission. In such a semiconductor light emitting device, a variety of color lights can be realized depending upon the composition of the material of the semiconductor or the kind of impurities.

By incorporating a plurality of semiconductor light emitting chips having different emission colors respectively in a semiconductor light emitting device, a semiconductor light emitting device having a plurality of emission colors can be obtained. When the emission colors of two semiconductor light emitting chips have the complimentary color relationship with each other, visibly white light emission can be realized by making the two semiconductor light emitting chips emit light at the same time with a suitable brightness ratio.

For example, by incorporating a semiconductor chip having blue emission color and a semiconductor chip having yellow green emission color, a semiconductor light emitting device having emission colors including blue, yellow green and an intermediate color thereof can be obtained. By suitably determining the brightness ratio between blue light and yellow green light, white color emission can be obtained.

In a conventional semiconductor light emitting device having the above-mentioned structure, a plurality of semiconductor light emitting chips having different emission colors are laterally disposed on a support body.

However, in a semiconductor light emitting device having such a structure, when semiconductor light emitting chips having different emission colors respectively are made to emit light at the same time, sometimes respective emission colors of the semiconductor light emitting chips are not sufficiently mixed. This is because, since the semiconductor light emitting chips are shifted, though only slightly, with respect to each other in the lateral direction, not only an intermediate color but also the respective emission colors of the semiconductor light emitting chips are observed. Further, depending upon the angle of observation, the emission colors are not well mixed, so that white emission light cannot be obtained.

Further, there are semiconductor light emitting devices in which a fluorescent substance having a suitable fluorescent color is applied on the outside of each semiconductor chip in order to obtain a specified emission color such as white. However, with such a structure, though the above-mentioned problem does not occur, only one emission color can be obtained.

SUMMARY OF THE INVENTION

An object of the present invention is to provide a semiconductor light emitting device by which a plurality of emission colors can be obtained.

Another object of the present invention is to provide a semiconductor light emitting device in which a plurality of emission colors of a plurality of semiconductor light emitting chips can be sufficiently mixed.

A semiconductor light emitting device according to the present invention includes a first semiconductor light emitting chip in which a first light emitting layer is formed on a first substrate, and a second semiconductor light emitting chip in which a second light emitting layer is formed on a second substrate, the second semiconductor light emitting chip being stacked on and bonded to the first semiconductor light emitting chip.

The first and second semiconductor light emitting chips may be bonded to each other by a bonding material such as an adhesive.

The first and second semiconductor light emitting chips may have emission colors respectively within the range of visible light wavelengths. These emission colors preferably have the complementary color relationship with each other. In this case, by making the semiconductor light emitting chips emit light at the same time, visibly white emission color can be realized.

It is preferable that the first and second light emitting layers at least partly (preferably substantially wholly) overlap each other when seen in the direction of the stacking of the first and second semiconductor light emitting chips. In such a case, since a part or substantially the whole of the light emitting regions of the first and second semiconductor light emitting chips overlap each other, the emission colors thereof are sufficiently mixed and seen in this sufficiently mixed state.

Further, the main direction of the light emission of the first semiconductor light emitting chip may be a direction of going from the first semiconductor light emitting chip toward the second semiconductor light emitting chip. In this case, it is preferable that the above-mentioned second substrate is made of a material having permeability with respect to the light emitted from the first light emitting layer. Further, when an adhesive is used as a bonding material, the adhesive preferably has permeability with respect to the light emitted from the first light emitting layer.

Thereby, when the layered first and second semiconductor light emitting chips are seen from the second semiconductor light emitting chip side, the light emitted from the first light emitting layer is seen through the adhesive and the second substrate of the second semiconductor light emitting chip.

Further, it is preferable that, on the first substrate, the first light emitting layer is formed on the surface on the opposite side of the second semiconductor light emitting chip, and the first substrate is formed of a material having permeability with respect to the light emitted from the first light emitting layer. Thereby, when the layered first and second semiconductor light emitting chips are seen from the second semiconductor light emitting chip side, the light emitted from the first light emitting layer is seen through the first substrate and the second substrate of the second semiconductor light emitting chip.

The above-mentioned stacked and bonded first and second semiconductor light emitting chips may be mounted on an insulating substrate, on one surface of which external connection electrodes are formed. The first semiconductor light emitting chip may have electrodes on the surface thereof on the opposite side of the second semiconductor light emitting chip, and these electrode may be bump-bonded to the external connection electrodes. The second semiconductor light emitting chip may have electrodes on the surface thereof, and these electrodes may be wire-bonded to the external connection electrodes. The external connection electrodes may be extended to the other surface of the insulating substrate, and may be connected to mounting electrodes for mounting this semiconductor light emitting device on a wiring substrate.

A semiconductor light emitting device having such a structure can be suitably surface-mounted on a wiring substrate. Since the main direction of seeing the semiconductor light emitting device mounted on the wiring substrate is substantially perpendicular to the wiring substrate, the direction of seeing substantially coincides with the direction of the stacking of the first and second semiconductor light emitting chips. Therefore, the emission color of the first semiconductor light emitting chip and the emission color of the second semiconductor light emitting chip are sufficiently mixed and seen in this sufficiently mixed state.

The above-mentioned external connection electrodes may include a first and a second control electrodes insulated from each other for independently driving the first and second semiconductor light emitting chips. The electrodes of the first semiconductor light emitting chip may be bump-bonded to the first control electrodes and the electrodes of the second semiconductor light emitting chip may be wire-bonded to the second control electrodes.

It is possible to make only the first semiconductor light emitting chip emit light using the first control electrodes, and to make only the second semiconductor light emitting chip emit light using the second control electrodes. Further, it is possible to make the first and second semiconductor light emitting chips emit light at the same time by using the first and second control electrodes. Therefore, by this semiconductor light emitting device, three emission colors including the emission color of the first semiconductor light emitting chip, the emission color of the second semiconductor light emitting chip, and the mixed color of these emission colors can be obtained.

The electrodes and the first light emitting layer of the first semiconductor light emitting chip maybe provided either on the same surface of the first substrate or on the opposite surface thereof respectively. Similarly, the electrodes and the second light emitting layer of the second semiconductor light emitting chip may be provided either on the same surface of the first substrate or on the opposite surface thereof respectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
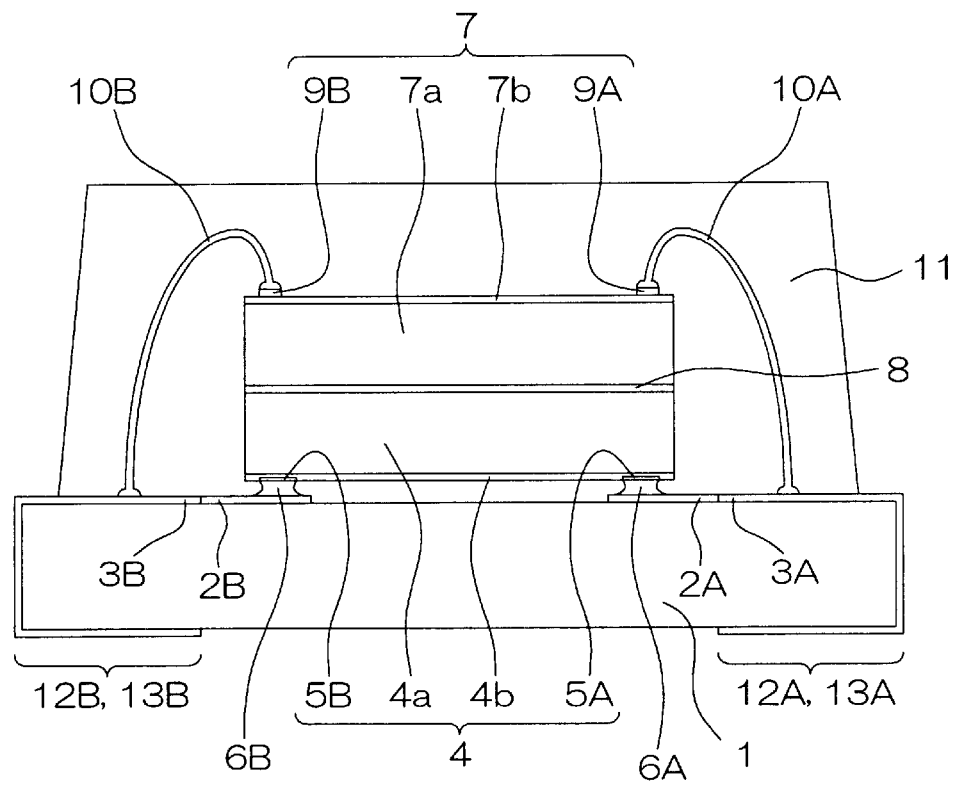
FIG. 1 is a schematic sectional view of a semiconductor light emitting device according to an embodiment of the present invention.
Figure 2:
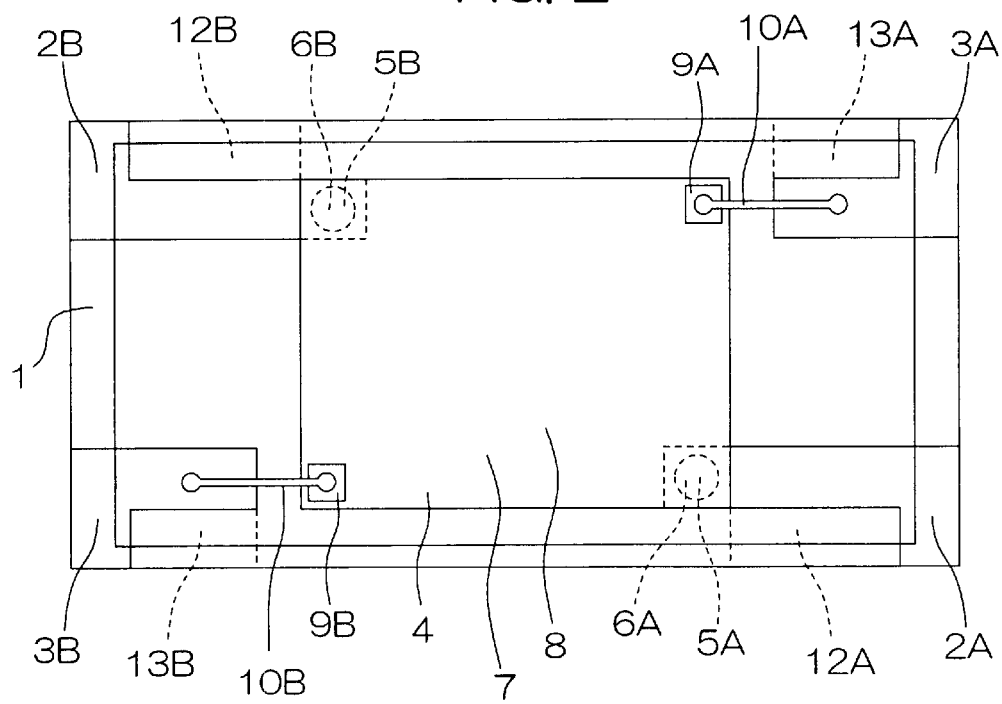
FIG. 2 is a schematic plan view of the semiconductor light emitting device of FIG. 1.

FIG. 1 is a schematic sectional view of a semiconductor light emitting device according to an embodiment of the present invention, and FIG. 2 is a schematic plan view of the same.

On a rectangular insulating substrate 1, a pair of electrodes comprising external connection electrodes 2A, 2B are provided in diagonally positioned portions including a pair of corner portions respectively. Another pair of electrodes comprising external connection electrodes 3A, 3B are provided in the other diagonally positioned portions including a pair of corner portions respectively.

A rectangular GaN based light emitting diode (LED) chip 4 is disposed substantially in the center of one surface of the insulating substrate 1. The GaN based LED chip 4 includes a sapphire substrate 4a and a GaN based compound semiconductor thin layer 4b formed on a surface opposed to the insulating substrate 1 and constituting a light emitting layer. The emission color of the GaN based compound semiconductor thin layer 4b is blue.

The GaN based LED chip 4 further includes a pair of electrodes 5A, 5B provided on the surface where the GaN based compound semiconductor thin layer 4b is formed. The electrodes 5A, 5B are provided in the vicinity of two corner portions close to the external connection electrodes 2A, 2B respectively, among the four corner portions of the GaN based LED chip 4. The external connection electrodes 2A, 2B are extended to the regions opposed to the electrodes 5A, 5B respectively. The external connection electrode 2A and the electrode 5A are electrically connected to each other by a bump 6A. The external connection electrode 2B and the electrode 5B are electrically connected to each other by a bump 6B.

On the surface of the GaN based LED chip 4, which is on the opposite side of the GaN based compound semiconductor thin layer 4b, a GaP based light emitting diode (LED) chip 7 is disposed in the stacked manner. The GaN based LED chip 4 and the GaP based LED chip 7 have substantially the same area and shape when seen in the direction of the stacking thereof, and therefore, the region in which the GaP based LED chip 7 exists and the region in which the GaN based LED chip 4 exists coincide with each other.

The GaN based LED chip 4 and GaP based LED chip 7 are bonded to each other by a transparent adhesive 8. The transparent adhesive 8 has permeability with respect to visible light.

The GaP based LED chip 7 includes a GaP based compound semiconductor substrate 7a, and a GaP based compound semiconductor thin layer 7b formed on the surface of the GaP based compound semiconductor substrate 7a on the opposite side of the surface thereof bonded to the GaN based LED chip 4. The GaP based compound semiconductor thin layer 7b constitutes a light emitting layer, the emission color of which is yellow green.

The GaP based LED chip 7 further includes a pair of electrodes 9A, 9B provided on the surface where the GaP based compound semiconductor thin layer 7b is formed. The electrodes 9A, 9B are provided in the vicinity of two corner portions of the GaP based LED chip 7 respectively, which are close to the external connection electrodes 3A, 3B, among the four corner portions of the chip 7. When seen in the direction of the stacking of the GaN based LED chip 4 and the GaP based LED chip 7, the external connection electrodes 3A, 3B are extended to positions in the vicinity of the GaP based LED chip 7 but do not exist in the region of the GaP based LED chip 7. The electrode 9A and the external connection electrode 3A are electrically connected to each other by a bonding wire 10A. The electrode 9B and the external connection electrode 3B are electrically connected to each other by a bonding wire 10B.

When seen in the direction of the stacking of the GaN based LED chip 4 and the GaP based LED chip 7, the region in which the GaN based compound semiconductor thin layer 4b exists and the region in which the GaP based compound semiconductor thin layer 7b exists coincide with each other except the region in which the electrodes 5A, 5B, 9A, 9B exist.

On the above-mentioned one surface of the insulating substrate 1, the part including GaN based LED chip 4, GaP based LED chip 7, the bonding wires 10A, 10B and a part of each of the external connection electrodes 2A, 2B, 3A, 3B is covered with a transparent resin 11. The transparent resin 11 has permeability with respect to visible light.

The external connection electrodes 2A, 2B, 3A, 3B are elongated from the above-mentioned one surface of the insulating substrate 1 to the side surfaces thereof and connected to mounting electrodes 12A, 12B, 13A, 13B respectively provided on the other surface of the insulating substrate 1. This semiconductor light emitting device can be mounted on a wiring substrate through the mounting electrodes 12A, 12B, 13A, 13B.

The sapphire substrate 4a and the GaP based compound semiconductor substrate 7a have permeability with respect to blue light emitted from the GaN based compound semiconductor thin layer 4b.

When electric current is supplied between the external connection electrode 2A and the external connection electrode 2B, GaN based compound semiconductor thin layer 4b of the GaN based LED chip 4 emits blue light. This blue light passes the sapphire substrate 4a, the transparent adhesive 8 and the GaP based compound semiconductor substrate 7a, and is observed.

When electric current is supplied between the external connection electrode 3A and the external connection electrode 3B, GaP based compound semiconductor thin layer 7b of the GaP based LED chip 7 emits yellow green light.

Further, when electric current is supplied both between the external connection electrode 2A and the external connection electrode 2B and between the external connection electrode 3A and the external connection electrode 3B at the same time, the GaN based compound semiconductor thin layer 4b of the GaN based LED chip 4 emits blue light and the GaP based compound semiconductor thin layer 7b of the GaP based LED chip 7 emits yellow green light. Therefore, an intermediate color light between the blue light and the yellow green light is observed. By suitably adjusting the brightness ratio between the blue light and the yellow light, white light can be obtained.

As a result, this semiconductor light emitting device can emit lights of a variety of colors including blue, yellow green, and an intermediate color therebetween such as white.

When seen in the direction of the stacking of the GaN based LED chip 4 and the GaP based LED chip 7, the region in which the GaN based compound semiconductor thin layer 4b exists (the region of blue light emission) substantially coincides with the region in which the GaP based compound semiconductor thin layer 7b exists (the region of yellow green light emission) substantially coincide with each other. Consequently, when seen in the direction of the stacking of the GaN based LED chip 4 and the GaP based LED chip 7 from the GaP based LED chip 7 side, only an intermediate color light (for example, white light) between the blue light and yellow green light is seen.

That is, there is substantially no region in which only blue light is seen and no region in which only yellow green light is seen.

When this semiconductor light emitting device is mounted on a wiring substrate, the semiconductor light emitting device is seen mainly in the direction substantially perpendicular to the wiring substrate. In a conventional semiconductor light emitting device, a GaN based LED chip and a GaP based LED chip are laterally disposed on a support body. In this case, when such a semiconductor light emitting device is mounted on a wiring substrate, the GaN based LED chip and the GaP based LED chip are disposed in the direction along the mounting surface of the wiring substrate. Therefore, in this case, when the GaN based LED chip and the GaP based LED chip are made to emit light at the same time, blue light and yellow green light are mixed to produce white light only when seen in specified oblique directions in which the GaN based LED chip and the GaP based LED chip are seen in overlapped state. That is, in the conventional semiconductor light emitting device, blue light and yellow green light are sufficiently mixed to produce white light only when seen in a narrow range of directions.

On the contrary, when the semiconductor light emitting device of this embodiment of the present invention is mounted on a wiring substrate via mounting electrodes 12A, 12B, 13A, 13B, the GaN based LED chip 4 and the GaP based LED chip 7 are disposed in the direction perpendicular to the mounting surface of the wiring substrate. Consequently, when the GaN based LED chip 4 and the GaP based LED chip 7 are made to emit light at the same time, blue light and yellow green light are sufficiently mixed so that white light can be seen in a wide range of directions.

A reflecting casing with only one side opened may be provided further outside the transparent resin 11. In this case, light emitted from the GaP based LED chip 7 or the GaN based LED chip 4 is reflected by the reflecting casing to be projected in a direction along the insulating substrate 1.

Although the embodiment of the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Application No.2001-138982 filed in Japanese Patent Office on May 9, 2001, and the whole disclosure of the Japanese application is incorporated herein by reference.

What is claimed:

1. A semiconductor light emitting device, comprising:
   a first semiconductor light emitting chip in which a first semiconductor light emitting layer is formed on a first substrate,
   a second semiconductor light emitting chip stacked on and bonded to the first semiconductor light emitting chip, in which a second semiconductor light emitting layer is formed on a second substrate, and
   an insulating substrate having external connection electrodes on one surface thereof, wherein
      a stacked structure of the first and second semiconductor light emitting chips are mounted on the one surface of the insulating substrate, the first semiconductor light emitting chip having electrodes on the surface thereof on the opposite side of the second semiconductor light emitting chip, the electrodes being bump-bonded to the external connection electrodes and,
      in which the second semiconductor light emitting chip has electrodes on the surface thereof, and the electrodes are wire-bonded to the external connection electrodes.

2. A semiconductor light emitting device as claimed in claim 1, further including a bonding material for bonding the stacked first and second semiconductor light emitting chips to each other.

3. A semiconductor light emitting device as claimed in claim 1, in which emission colors of the first and second semiconductor chips have the complimentary color relationship with each other.

4. A semiconductor light emitting device as claimed in claim 1, in which the first and second chips are stacked in such a manner that the first and second light emitting layers at least partly overlap each other when seen in a direction of the stacking of the first and second semiconductor light emitting chips.

5. A semiconductor light emitting device as claimed in claim 1, in which a main direction of the light emission of the first semiconductor light emitting chip is a direction of going from the first semiconductor light emitting chip toward the second semiconductor light emitting chip, and the second substrate is made of a material having permeability with respect to the light emitted from the first light emitting layer.

6. A semiconductor light emitting device as claimed in claim 5, further including a bonding material for bonding the first and second semiconductor light emitting chips to each other, which has permeability with respect to the light emitted from the first light emitting layer.

7. A semiconductor light emitting device as claimed in claim 5, in which the first light emitting layer is formed on a surface, of the first substrate, on the opposite side of the second semiconductor light emitting chip, and the first substrate is formed of a material having permeability with respect to the light emitted from the first light emitting layer.

8. A semiconductor light emitting device, comprising:

a first semiconductor light emitting chip in which a first semiconductor light emitting layer is formed on a first substrate, a second semiconductor light emitting chip stacked on and bonded to the first semiconductor light emitting chip, in which a second semiconductor light emitting layer is formed on a second substrate, and an insulating substrate having external connection electrodes on one surface thereof, wherein a stacked structure of the first and second semiconductor light emitting chips are mounted on the one surface of the insulating substrate, the first semiconductor light emitting chip having electrodes on the surface thereof on the opposite side of the second semiconductor light emitting chip, the electrodes being bump-bonded to the external connection electrodes and in which the external connection electrodes are extended to the other surface of the insulating substrate, and connected to mounting electrodes for mounting the semiconductor light emitting device on a wiring substrate.

9. A semiconductor light emitting device, comprising:

a first semiconductor light emitting chip in which a first semiconductor light emitting layer is formed on a first substrate, a second semiconductor light emitting chip stacked on and bonded to the first semiconductor light emitting chip, in which a second semiconductor light emitting layer is formed on a second substrate, and an insulating substrate having external connection electrodes on one surface thereof, wherein a stacked structure of the first and second semiconductor light emitting chips are mounted on the one surface of the insulating substrate, the first semiconductor light emitting chip having electrodes on the surface thereof on the opposite side of the second semiconductor light emitting chip, the electrodes being bump-bonded to the external connection electrodes and in which the external connection electrodes are extended to the other surface of the insulating substrate, and connected to mounting electrodes for mounting the semiconductor light emitting device on a wiring substrate.

10. A semiconductor light emitting device as claimed in claim 8, further including a bonding material for bonding the stacked first and second semiconductor light emitting chips to each other.

11. A semiconductor light emitting device as claimed in claim 8, in which emission colors of the first and second semiconductor chips have the complimentary color relationship with each other.

12. A semiconductor light emitting device as claimed in claim 8, in which the first and second chips are stacked in such a manner that the first and second light emitting layers at least partly overlap each other when seen in a direction of the stacking of the first and second semiconductor light emitting chips.

13. A semiconductor light emitting device as claimed in claim 8, in which a main direction of the light emission of the first semiconductor light emitting chip is a direction of going from the first semiconductor light emitting chip toward the second semiconductor light emitting chip, and the second substrate is made of a material having permeability with respect to the light emitted from the first light emitting layer.

14. A semiconductor light emitting device as claimed in claim 13, further including a bonding material for bonding the first and second semiconductor light emitting chips to each other, which has permeability with respect to the light emitted from the first light emitting layer.

15. A semiconductor light emitting device as claimed in claim 13 in which the first light emitting layer is formed on a surface, of the first substrate, on the opposite side of the second semiconductor light emitting chip, and the first substrate is formed of a material having permeability with respect to the light emitted from the first light emitting layer.

16. A semiconductor light emitting device as claimed in claim 9, further including a bonding material for bonding the stacked first and second semiconductor light emitting chips to each other.

17. A semiconductor light emitting device as claimed in claim 9, in which emission colors of the first and second semiconductor chips have the complimentary color relationship with each other.

18. A semiconductor light emitting device as claimed in claim 9, in which the first and second chips are stacked in such a manner that the first and second light emitting layers at least partly overlap each other when seen in a direction of the stacking of the first and second semiconductor light emitting chips.

19. A semiconductor light emitting device as claimed in claims 9, in which a main direction of the light emission of the first semiconductor light emitting chip is a direction of going from the first semiconductor light emitting chip toward the second semiconductor light emitting chip, and the second substrate is made of a material having permeability with respect to the light emitted from the first light emitting layer.

20. A semiconductor light emitting device as claimed in claim 19 further including a bonding material for bonding the first and second semiconductor light emitting chips to each other, which has permeability with respect to the light emitted from the first light emitting layer.

21. A semiconductor light emitting device as claimed in claim 19, in which the first light emitting layer is formed on a surface, of the first substrate, on the opposite side of the second semiconductor light emitting chip, and the first substrate is formed of a material having permeability with respect to the light emitted from the first light emitting layer.

* * * * *